(12) United States Patent
Hasegawa et al.

(10) Patent No.: US 12,127,340 B2
(45) Date of Patent: Oct. 22, 2024

(54) WIRING SUBSTRATE

(71) Applicant: KYOCERA Corporation, Kyoto (JP)

(72) Inventors: Yoshihiro Hasegawa, Yasu (JP);
Yasuhiro Higashikawa, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 449 days.

(21) Appl. No.: 17/762,774

(22) PCT Filed: Sep. 23, 2020

(86) PCT No.: PCT/JP2020/035743
§ 371 (c)(1),
(2) Date: Mar. 23, 2022

(87) PCT Pub. No.: WO2021/065601
PCT Pub. Date: Apr. 8, 2021

(65) Prior Publication Data
US 2022/0418100 A1    Dec. 29, 2022

(30) Foreign Application Priority Data

Sep. 30, 2019 (JP) ................................. 2019-178275

(51) Int. Cl.
  *H01L 23/498* (2006.01)
  *H05K 1/02* (2006.01)
  *H05K 1/11* (2006.01)

(52) U.S. Cl.
  CPC ..... *H05K 1/0298* (2013.01); *H01L 23/49822* (2013.01); *H05K 1/115* (2013.01)

(58) Field of Classification Search
  CPC .................................................. H01L 23/498
  USPC .......................................................... 174/255
  See application file for complete search history.

(56) References Cited

U.S. PATENT DOCUMENTS

| | | | | |
|---|---|---|---|---|
| 2013/0014979 | A1* | 1/2013 | Uzoh | H01R 13/03 174/250 |
| 2014/0124928 | A1* | 5/2014 | Lin | H01L 24/11 257/738 |
| 2015/0305153 | A1* | 10/2015 | Imafuji | H05K 3/4007 174/261 |
| 2016/0027747 | A1* | 1/2016 | Ryu | H01L 24/05 257/737 |
| 2016/0327695 | A1* | 11/2016 | Masuyama | B29C 33/424 |

FOREIGN PATENT DOCUMENTS

| | | |
|---|---|---|
| JP | 2001-274545 A | 10/2001 |
| JP | 2005-183672 A | 7/2005 |
| JP | 2015-216344 A | 12/2015 |

* cited by examiner

*Primary Examiner* — Stanley Tso
(74) *Attorney, Agent, or Firm* — Volpe Koenig

(57) ABSTRACT

A wiring substrate according to the present disclosure includes: an insulation layer disposed at an outermost layer; an electrode conductor disposed at a surface of the insulation layer with a seed layer being interposed therebetween; a nickel layer configured to cover at least one of the electrode conductors and include a contact portion that comes into contact with a surface of the seed layer; and a gold layer configured to cover the nickel layer. The nickel layer includes a plurality of gaps at the contact portion, at least a portion of the gaps includes an opening toward the contact portion, and a portion of the gold layer is disposed in at least a portion of the gaps.

8 Claims, 5 Drawing Sheets

WIRING SUBSTRATE

TECHNICAL FIELD

The present invention relates to a wiring substrate.

BACKGROUND ART

As in a substrate described in Patent Document 1, in a portion where sealing resins intersect, the sealing resins used at the time of mounting an electrode plated with Ni—Au, an insulating film, and elements, this portion is a point where materials having different physical properties such as thermal expansion coefficient come into contact with each other. Such a point where three materials come into contact is a portion where a crack is more likely to occur due to stress such as heat generated at the time of installing the substrate on a motherboard or heat generated at the time of actuating elements.

CITATION LIST

Patent Literature

Patent Document 1: JP 2005-183672 A

SUMMARY

A wiring substrate according to the present disclosure includes: an insulation layer disposed at an outermost layer; an electrode conductor disposed at a surface of the insulation layer with a seed layer being interposed therebetween; a nickel layer configured to cover at least one of the electrode conductors and include a contact portion that comes into contact with a surface of the seed layer; and a gold layer configured to cover the nickel layer. The nickel layer includes a plurality of gaps at the contact portion, at least a portion of the gaps includes an opening toward the contact portion, and a portion of the gold layer is disposed in at least a portion of the gaps.

DESCRIPTION OF EMBODIMENTS

As described above, a wiring substrate according to the present disclosure includes a nickel layer configured to cover a surface and a side surface of an electrode conductor so as to come into contact with the electrode conductor, and also to include a contact portion that comes into contact with a seed layer. This nickel layer includes a plurality of gaps having an opening toward the contact portion, and a portion of a gold layer is disposed in at least a portion of the gaps. Since gold that is softer than nickel exists in at least a portion of the gaps of the contact portion formed in the nickel layer, it is possible to alleviate stress that occurs, as compared with a case where only nickel is provided. This makes it possible to reduce the occurrence of cracks, in particular, the occurrence of cracks at a point where three materials having different physical properties come into contact.

Figure 1:
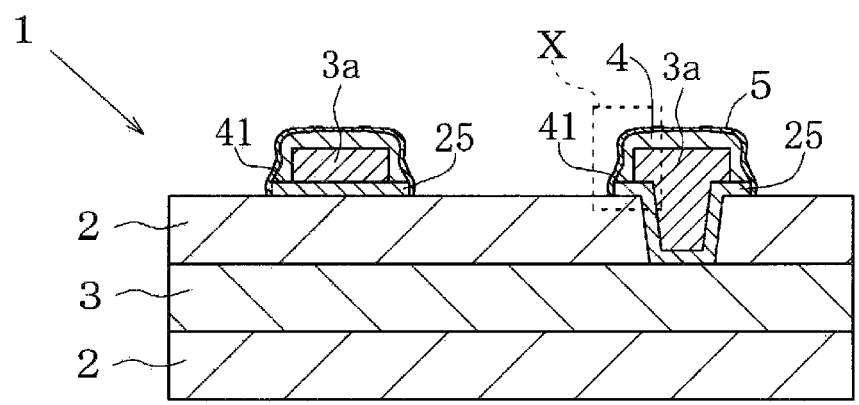
FIG. 1 is a schematic view illustrating a main portion of a wiring substrate according to one embodiment of the present disclosure.

A wiring substrate according to an embodiment of the present disclosure will be described with reference to FIGS. 1 and 2. FIG. 1 illustrates a main portion of a wiring substrate 1 according to an embodiment of the present disclosure.

The wiring substrate 1 includes an insulation layer 2 and an electrical conductor layer 3. The insulation layer 2 is disposed at an outermost layer of the wiring substrate 1 on at least one side. An electrode conductor 3a is disposed on a surface of the insulation layer 2 disposed at the outermost layer, with a seed layer 25 being interposed therebetween. No particular limitation is applied to the insulation layer 2, provided that it is made out of a material having an insulating property. Examples of the material having an insulating property include resins such as an epoxy resin, a bismaleimide-triazine resin, a polyimide resin, and a polyphenylene ether resin. Two or more of these resins may be mixed and used. In a case where a plurality of insulation layers 2 exist as illustrated in FIG. 1, each of the insulation layers 2 may be made of the same resin, or may be made of different resins.

Inorganic insulating fillers made of, for example, silica, barium sulfate, talc, clay, glass, calcium carbonate, or titanium oxide may be dispersed in the insulation layer 2. There is no particular limitation applied to the thickness of the insulation layer 2, and, for example, this thickness falls in a range of approximately 5 µm or more and 200 µm or less. The plurality of insulation layers 2 may have the same thickness, or may have thicknesses differing from each other.

The electrical conductor layer 3 is a conductor made of copper or the like, and is composed, for example, of copper foil or copper plating. There is no particular limitation applied to the thickness of the electrical conductor layer 3, and, for example, this thickness falls in a range of 5 µm or more and 70 µm or less. In a case where there are a plurality of electrical conductor layers 3, these electrical conductor layers 3 may be composed of the same conductor, or may be composed of different conductors.

The electrode conductor 3a disposed on the surface of the insulation layer 2 disposed at the outermost layer with the seed layer 25 being interposed therebetween is used to electrically connect the wiring substrate 1 and an element or to electrically connect the wiring substrate 1 and the motherboard. The electrode conductor 3a is also a conductor made of copper or the like, and is composed, for example, of copper foil or copper plating. As illustrated in FIG. 1, the electrode conductor 3a may be formed so as to be electrically connected to the electrical conductor layer 3, or may be formed so as to be electrically separate from the electrical conductor layer 3.

In a case where the electrode conductor 3a is electrically connected to the electrical conductor layer 3, the electrode conductor 3a and the electrical conductor layer 3 are connected by way of a via hole conductor formed in the insulation layer 2. The via hole conductor can be obtained by precipitating a conductor such as copper, for example, copper plating or the like on a hole that extends through the upper and lower surfaces of the insulation layer 2. The hole that extends through the upper and lower surfaces of the insulation layer 2 has an inner diameter that falls, for example, in a range of approximately 50 μm or more and 200 μm or less. The extending hole is formed through a laser machining process such as CO2 laser or UV-YAG laser, for example.

A nickel layer 4 is disposed on the upper surface and a side surface of the electrode conductor 3a. That is, the nickel layer 4 covers the electrode conductor 3a. In addition, the nickel layer 4 includes a contact portion 41 configured to come into contact with the surface of the seed layer 25. The nickel layer 4 has a function of protecting the electrode conductor 3a. Specifically, in a case where the electrode conductor 3a is made of copper, if solder in a melt state is attached to the electrode conductor 3a, brittle alloy with solder and copper is generated due to heat of the solder. The electrode conductor 3a is covered with the nickel layer 4 so that such brittle alloy is not generated.

The nickel layer 4 does not need to be formed on all the electrode conductors 3a disposed on the surface of the insulation layer 2 that is disposed at the outermost layer with the seed layer 25 being interposed therebetween. It is only necessary that the nickel layer 4 is formed on at least one electrode conductor 3a. Specifically, of all the electrode conductors 3a, it is only necessary that the nickel layer 4 is formed on an electrode conductor 3a to which solder is attached.

The nickel layer 4 is formed, for example, through electroless plating. The nickel layer 4 has a thickness, for example, that falls in a range of approximately 1.5 μm or more and 2.2 μm or less. In a case where the nickel layer 4 has such a thickness, it is possible to sufficiently suppress generation of brittle alloy as described above.

The nickel layer 4 is in contact with a surface of the seed layer 25. A second nickel layer 4b, which will be described later, is disposed on a portion (contact portion 41) where the nickel layer 4 and the seed layer 25 are in contact with each other. A first nickel layer 4a, which will be described later, is disposed on a surface of the electrode conductor 3a. The thickness (height) of the second nickel layer 4b from the seed layer 25 is smaller than the thickness of the first nickel layer 4a from the surface of the electrode conductor 3a. At the nickel layer 4 disposed above the contact portion 41, the first nickel layer 4a is disposed on the second nickel layer 4b. Thus, for example, it is greater than the thickness of the nickel layer 4 disposed on a side surface of the electrode conductor 3a. This increases the contact surface area between the nickel layer 4 and the seed layer 25, which leads to an improvement in the connection strength.

Figure 2:
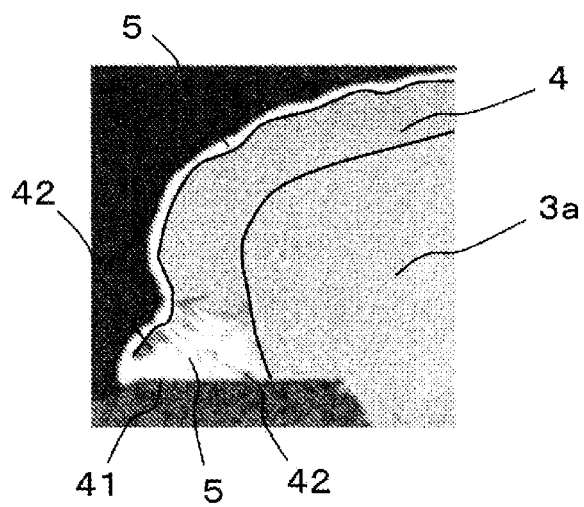
FIG. 2 is a photograph of an electron microscope showing one example of a region X illustrated in FIG. 1.

As illustrated in FIG. 2, the nickel layer 4 includes a plurality of gaps 42. FIG. 2 is a photograph of an electron microscope showing one example of a region X illustrated in FIG. 1. The gaps 42 each include an opening toward the contact portion 41, and a portion of a gold layer 5, which will be described later, is disposed in at least a portion of the gap 42. With the configuration in which the portion of the gold layer 5 is disposed in at least a portion of the gap 42, the contact portion 41 and its surroundings are made soft, as compared with a case where only the nickel layer 4 is provided. This makes it possible to alleviate the occurring stress.

The gold layer 5 is disposed on a surface of the nickel layer 4. That is, the gold layer 5 covers the nickel layer 4. With the cover using the gold layer 5, the wettability of solder improves. The gold layer 5 is formed, for example, through electroless plating. The gold layer 5 has a thickness that falls, for example, in a range of approximately 0.09 μm or more and 0.15 μm or less.

The nickel layer 4 including the gaps 42 at or around the contact portion 41 as described above is formed, for example, through a method of manufacturing a wiring substrate that will be described later.

Figure 3:
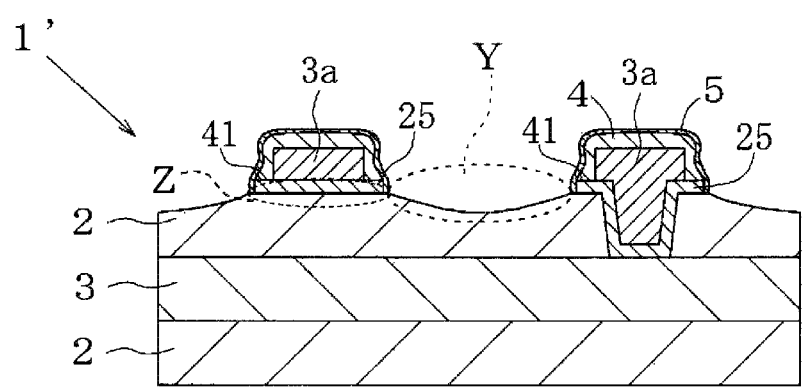
FIG. 3 is a schematic view illustrating a main portion of a wiring substrate according to another embodiment of the present disclosure.

Next, a wiring substrate according to another embodiment of the present disclosure will be described with reference to FIG. 3. FIG. 3 illustrates a main portion of a wiring substrate 1' according to another embodiment of the present disclosure. In the wiring substrate 1' according to another embodiment, the same reference characters are attached to the same members as those of the wiring substrate 1 according to the embodiment described above, and detailed explanation thereof is omitted.

In the wiring substrate 1 according to the embodiment, the surface of the insulation layer 2 where the electrode conductor 3a is disposed with the seed layer 25 being interposed therebetween is substantially flat at both of a portion where the electrode conductor 3a is disposed and a portion that exists between the electrode conductors 3a adjacent to each other, and substantially no height difference exists.

On the other hand, in the wiring substrate 1' according to another embodiment, a surface of a first region Y of the insulation layer 2 that exists between the electrode conductors 3a adjacent to each other as illustrated in FIG. 3 is disposed at a position lower than a surface of a second region Z of the insulation layer 2 where the electrode conductor 3a is disposed. With such a configuration, the direction in which stress acts changes into an oblique direction from a direction orthogonal to the insulation layer 2. This makes it possible to disperse stress at a point where three materials having different physical properties come into contact, which makes it possible to alleviate a load acting on the insulation layer 2. In addition, it is possible to lengthen the distance (distance on the surface of the insulation layer 2) between the electrode conductors 3a adjacent to each other. Thus, migration is less likely to occur between electrode conductors 3a.

The first region Y may include a recessed curved surface, and the recessed curved surface may be disposed so as to extend between contact portions 41 of nickel layers 4 adjacent to each other. In such a case, it is possible to further lengthen the distance between electrode conductors 3a, which is advantageous in suppressing migration.

There is no limitation applied to a method of manufacturing the wiring substrate according to the present disclosure. An embodiment of the method of manufacturing the wiring substrate according to the present disclosure will be described on the basis of a method (FIGS. 4A to 4D) of manufacturing the wiring substrate 1' according to another embodiment.

Figure 4A:
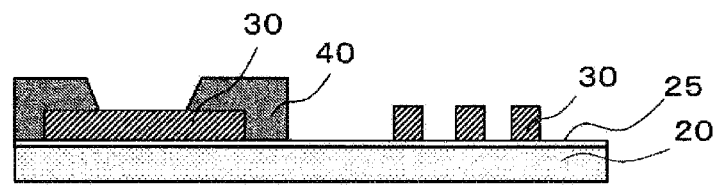
FIGS. 4A to 4D are explanatory diagrams illustrating an embodiment of a method of manufacturing a wiring substrate according to the present disclosure.

As illustrated in FIG. 4A, an electrode conductor 30 is formed at the surface of an insulation layer 20 with the seed layer 25 being interposed therebetween. The electrode conductor 30 is a conductor made of copper or the like as described above, and is composed, for example, of copper foil or copper plating. Next, prior to a step in which a seed layer (for example, Ni—Cr alloy or the like) formed on the surface of the insulation layer 20 is removed, solder resist is applied to a portion that needs to be protected to form a solder resist 40.

FIG. 4A illustrates a state in which the electrode conductors 30 are formed on the surface of the insulation layer 20 with the seed layer 25 being interposed therebetween. At the lower surface of this insulation layer 20, it may be possible to form a build-up layer in which an electrical conductor layer and an insulation layer are laminated alternately, as needed.

Figure 4B:
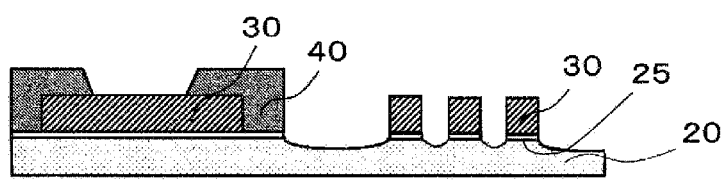

Next, the seed layer 25 formed on the surface of the insulation layer 20 is removed, as illustrated in FIG. 4B. The seed layer 25 is removed, for example, through an etching process, a blast process (wet-blast process or the like), or the like. For example, in a case of employing a wet-blast process, depression is generated at the surface of the insulation layer 20 interposed between the electrode conductors 30 adjacent to each other, as illustrated in FIG. 4B. With such depression being provided, it is possible to lengthen the distance (distance on the surface of the insulation layer 20) between the electrode conductors 30 adjacent to each other.

Figure 4C:
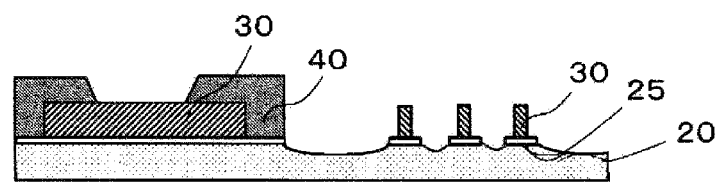

Next, as illustrated in FIG. 4C, an etching process is performed to remove an oxide layer formed on the surface of the electrode conductor 30. In a case where the electrode conductor 30 is made out of copper, copper etching is employed. A portion of the electrode conductor 30 itself is removed at the time of removing the oxide layer through the etching process, which makes the electrode conductor 30 thinner than before the etching process. At this time, the seed layer 25 (Ni—Cr alloy) disposed at a lower portion than the electrode conductor 30 removed through the etching process is exposed. In other words, this brings the Ni—Cr alloy in a state of being disposed at the periphery of the electrode conductor 30 made thinner by the etching process.

Figure 4D:
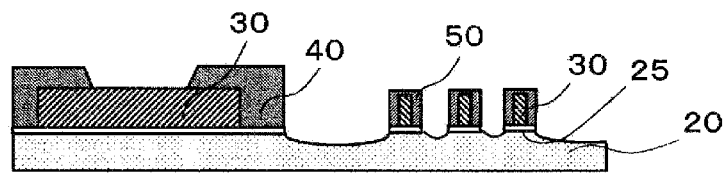

Next, as illustrated in FIG. 4D, a plating process is applied to the upper surface and the side surface of the electrode conductor 30 to form a plating layer 50. As for the plating layer 50, the nickel layer 4 is first formed, and the gold layer 5 is formed so as to cover the nickel layer 4. Specifically, the nickel layer 4 is formed at the upper surface and the side surface of the electrode conductor 30, for example, through electroless plating.

Figure 5A:
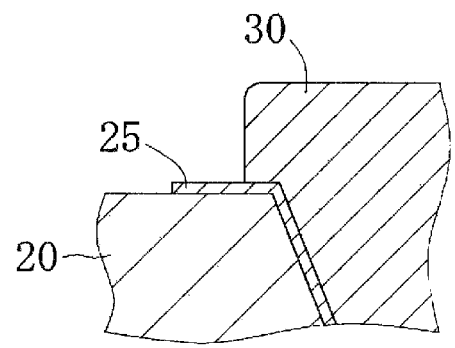
FIGS. 5A to 5D are schematic views used to explain details of the wiring substrate according to the present disclosure.

Here, processes of forming the nickel layer 4 as described above will be schematically illustrated. The diagram illustrated in FIG. 5A relates to the insulation layer 20 at which the seed layer 25 and the electrode conductor 30 have been formed prior to the electroless plating being applied for the purpose of forming the nickel layer 4.

Figure 5B:
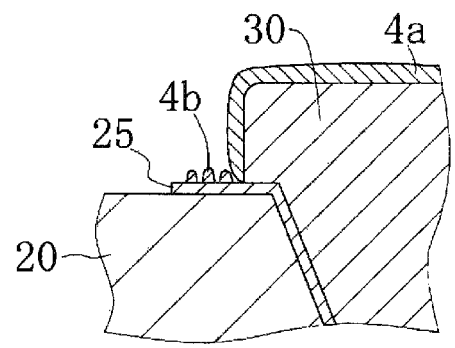

Next, a state at the time of starting the electroless plating is illustrated in FIG. 5B. As illustrated in FIG. 5B, the nickel layer 4 includes the first nickel layer 4a obtained through precipitation with the base being the surface of the electrode conductor 30, and the second nickel layer 4b obtained through precipitation with the base being the surface of the Ni—Cr alloy (seed layer 25) disposed at the periphery of the electrode conductor 30. The first nickel layer 4a is precipitated at the upper surface and the side surface of the electrode conductor 30. The second nickel layer 4b is precipitated into a pillar shape because the precipitation rate differs due to a difference in metals exposed at the surface of the alloy or the like.

Figure 5C:
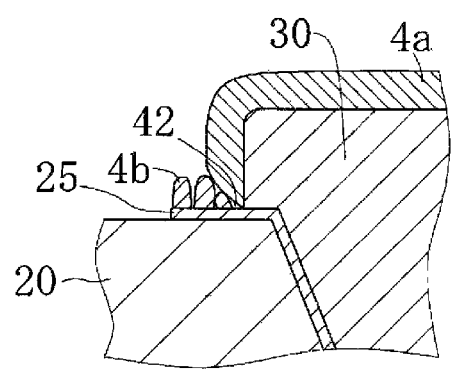

FIG. 5C illustrates a state in which the process of electroless plating for the purpose of forming the nickel layer 4 is in progress. The first nickel layer 4a and the second nickel layer 4b close to the first nickel layer 4a come into contact with each other. At this time, supply of the electroless plating liquid is eventually cut off at a portion between the first nickel layer 4a and the second nickel layer 4b that come into contact with each other, and this portion partially becomes a gap 42.

Figure 5D:
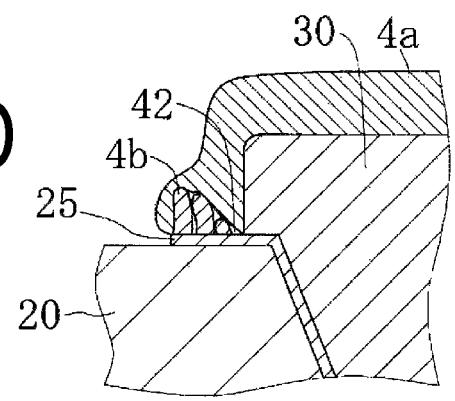

FIG. 5D illustrates a state in which the process of electroless plating for the purpose of forming the nickel layer 4 is finished. The gap 42 generated as a result of the supply of the electroless plating liquid being cut off is disposed between the first nickel layer 4a obtained through precipitation with the base being the surface of the electrode conductor 30 and the second nickel layer 4b obtained through precipitation with the base being the surface of the Ni—Cr alloy, or between second nickel layers 4b.

The second nickel layer 4b may include a thing tilted as a result of receiving pressure in a direction opposite to the electrode conductor 30 at the time of being brought into contact with the first nickel layer 4a. In addition, the second nickel layer 4b may be disposed and be tilted in a manner such that the distance from the electrode conductor 30 increases toward the upper direction from the insulation layer 20. From the viewpoint of increasing a direction in which stress can be alleviated, this case is advantageous, for example, because the gap 42 between second nickel layers 4b is created also in a direction tilted along the second nickel layer 4b.

After this, the gold layer 5 is formed, for example, through electroless plating so as to cover the nickel layer 4. At the time of forming the gold layer 5, a portion of the gold layer 5 enters at least a portion of the gap 42 formed in the nickel layer 4. Through these steps, the wiring substrate 1' according to another embodiment can be obtained.

The wiring substrate according to the present disclosure is not limited to the embodiment and the other embodiment described above. For example, in the wiring substrate 1 according to the embodiment described above and the wiring substrate 1' according to the other embodiment described above, the electrode conductor 3a, the nickel layer 4, and the gold layer 5 are laminated in this order. However, a palladium layer may exist between the nickel layer 4 and the gold layer 5. That is, the electrode conductor 3a, the nickel layer 4, the palladium layer, and the gold layer 5 may be laminated in this order. By forming the palladium layer, it is possible to further enhance the effect of the nickel layer 4, which further improves the effect of protecting the electrode conductor 3a. The thickness of the palladium layer is not particularly limited, and for example, falls in a range of 0.01 μm or more and 0.5 μm or less.

The wiring substrate may include solder at the gap 42. The solder is disposed, for example, between the first nickel layer 4a obtained through precipitation with the base being the surface of the electrode conductor 30 and the second nickel layer 4b obtained through precipitation with the base being the surface of the Ni—Cr alloy (seed layer 25), or between the second nickel layers 4b, or the like. With the solder being disposed at the gap 42, in a case where the first nickel layer 4a and the second nickel layer 4b thermally expand and contract, this configuration alleviates stress occurring between these layers and works to suppress a crack, for example, as compared with a case where the first nickel layer 4a covers the periphery of the second nickel layer 4b without any gap. In a case where the solder is disposed in a region surrounded by a plurality of the second nickel layers 4b and the seed layer 25 made of Ni—Cr alloy, this configuration alleviates stress occurring between the second nickel layers 4b and works to suppress a crack, and this configuration also alleviates stress occurring between the plurality of second nickel layers 4b and the seed layer 25 made of Ni—Cr alloy and works to suppress a crack, as compared with a case where the plurality of second nickel layers 4b are in close contact with each other. This makes it possible to provide the wiring substrate that has excellent reliability in terms of electrical connection.

For the solder, it is only necessary to employ a Sn—Ag—Cu base containing the constituent composition of, for example, tin of approximately 96.5%, silver of approximately 3%, and copper of approximately 0.5%, or a Sn—Ag—Bi—Cu base containing the constituent composition of tin of approximately 96%, silver of approximately 2.5%, bismuth of approximately 1%, and copper of approximately 0.5%, depending on application. Such solder is formed in a manner such that, for example, at the time of melting solder to cause it to stick to the surface of the gold layer 5, a portion of the melted solder enters at least a portion of the gap 42 formed at the nickel layer 4, and is solidified.

REFERENCE SIGNS LIST

1, 1' wiring substrate
2 insulation layer
3 electrical conductor layer
3a electrode conductor
4 nickel layer
4a first nickel layer
4b second nickel layer
25 seed layer
41 contact portion
42 gap
5 gold layer
20 insulation layer
30 electrode conductor
40 solder resist
50 plating layer (nickel layer and gold layer)

The invention claimed is:

1. A wiring substrate comprising:
an insulation layer disposed at an outermost layer;
an electrode conductor disposed at a surface of the insulation layer with a seed layer being interposed between the electrode conductor and the insulation layer;
a nickel layer configured to cover at least one of the electrode conductors and include a contact portion that comes into contact with a surface of the seed layer; and
a gold layer configured to cover the nickel layer, wherein
the nickel layer includes a plurality of gaps at the contact portion,
at least a portion of the gaps includes an opening toward the contact portion, and
a portion of the gold layer is disposed in at least the portion of the gaps,
wherein
the nickel layer includes:
a first nickel layer disposed on the electrode conductor; and
a second nickel layer disposed at an outer periphery of the electrode conductor, and
a thickness of the second nickel layer is smaller than a thickness of the first nickel layer.

2. The wiring substrate according to claim 1, wherein
the surface of the insulation layer includes:
a first region disposed between the electrode conductors adjacent to each other; and
a second region at which the electrode conductor is disposed, and
the first region is disposed at a position lower than the second region in a thickness direction of the insulation layer.

3. The wiring substrate according to claim 2, wherein
the first region includes a recessed curved surface.

4. The wiring substrate according to claim 3, wherein
the nickel layer covers each of the electrode conductors adjacent to each other, and
the recessed curved surface of the first region connects the contact portions of the nickel layers adjacent to each other.

5. The wiring substrate according to claim 1, wherein
the second nickel layer is disposed and is tilted in a manner such that a distance from the electrode conductor increases toward an upper direction from the insulation layer.

6. The wiring substrate according to claim 1, further comprising:
a palladium layer disposed between the nickel layer and the gold layer.

7. The wiring substrate according to claim 1, wherein solder is disposed at a portion of the gaps.

8. The wiring substrate according to claim 7, wherein the solder is disposed at the gap surrounded by a plurality of the second nickel layers and the seed layer.

* * * * *